US008108760B2

(12) United States Patent
Gross et al.

(10) Patent No.: US 8,108,760 B2
(45) Date of Patent: Jan. 31, 2012

(54) DECODING OF LINEAR CODES WITH PARITY CHECK MATRIX

(75) Inventors: Warren J. Gross, Montreal (CA); Shie Mannor, Montreal (CA); Gabi Sarkis, Montreal (CA)

(73) Assignee: The Royal Institute for the Advancement of Learning/McGill University, Montreal (CA)

( * ) Notice: Subject to any disclaimer, the term of this patent is extended or adjusted under 35 U.S.C. 154(b) by 377 days.

(21) Appl. No.: 12/503,607

(22) Filed: Jul. 15, 2009

(65) Prior Publication Data

US 2010/0017676 A1   Jan. 21, 2010

Related U.S. Application Data

(60) Provisional application No. 61/129,730, filed on Jul. 15, 2008.

(51) Int. Cl.
*H03M 13/00* (2006.01)
(52) U.S. Cl. ........ 714/781; 714/801; 714/752; 714/780; 714/784; 714/786; 714/794
(58) Field of Classification Search .................. 714/801, 714/752, 780, 781, 784, 786, 794
See application file for complete search history.

(56) References Cited

U.S. PATENT DOCUMENTS 6,633,856 B2 * 10/2003 Richardson et al. ............ 706/15
(Continued)

FOREIGN PATENT DOCUMENTS

| DE | EP 1511177 A2 * | 3/2005 |
|----|----------------|--------|
| DE | E 1536568 A1 * | 8/2006 |
| WO | WO2008034254 A1 | 3/2008 |
| WO | WO2008141453 A1 | 11/2008 |

OTHER PUBLICATIONS

Declercq et al., Decoding Algorithms for Nonbinary LDPC Codes over GF(q), Sep. 19, 2006, IEEE, pp. 1-27.*
Declercq et al., Decoding Algorithms for Nonbinary LDPC Codes over GF(q), Apr. 2007, IEEE, pp. 633-643.*
Voicila et al., Low-complexity decoding for non-binary LDPC codes in high order fields, Aug. 8, 2007, pp. 1-25.*
ISA/CA, "International Search Report", dated Sep. 17, 2009, pp. 1 to 3.

*Primary Examiner* — John J Tabone, Jr.
(74) *Attorney, Agent, or Firm* — Freedman & Associates

(57) ABSTRACT

A decoding method and system for stochastic decoding of linear codes with the parity check matrix comprising elements of a Galois field is provided. Each encoded sample of a set of encoded samples is first scaled by a scaling factor proportional to a noise level of the set of encoded samples. Each of the scaled encoded samples is then converted into a corresponding probability. For each probability a corresponding probability message is the generated by encoding each probability as a sequence of symbols or bits. Each probability message is then provided to a respective variable node of a logic circuitry for stochastic decoding. The logic circuitry represents a factor graph of the parity check matrix of the linear code. Using the logic circuitry each probability message is passed through the factor graph by performing for each received symbol at the variable nodes the equality function, at the permutation nodes one of multiplication and division, and at the parity check nodes the parity check function, wherein each of the variable nodes provides an output symbol in dependence upon each received symbol.

20 Claims, 9 Drawing Sheets

U.S. PATENT DOCUMENTS

| | | | |
|---|---|---|---|
| 7,178,080 B2 * | 2/2007 | Hocevar | 714/752 |
| 7,313,752 B2 * | 12/2007 | Kyung et al. | 714/801 |
| 7,458,009 B2 * | 11/2008 | Yu et al. | 714/800 |
| 7,536,623 B2 * | 5/2009 | Kim et al. | 714/752 |
| 7,669,109 B2 * | 2/2010 | Hocevar | 714/780 |
| 7,907,784 B2 * | 3/2011 | Gladkova et al. | 382/232 |
| 7,934,140 B2 * | 4/2011 | Oh et al. | 714/752 |
| 2005/0283707 A1 | 12/2005 | Sharon et al. | |
| 2006/0156181 A1 * | 7/2006 | Ha et al. | 714/758 |
| 2006/0206778 A1 | 9/2006 | Wehn et al. | |

\* cited by examiner

DECODING OF LINEAR CODES WITH PARITY CHECK MATRIX

This application claims the benefit of U.S. Provisional Patent Application No. 61/129,730 filed on Jul. 15, 2008, the entire contents of which are incorporated herein by reference.

FIELD OF THE INVENTION

The instant invention relates to the field of decoding of linear codes with a parity check matrix and in particular to a decoding method and system for stochastic decoding of linear codes with the parity check matrix comprising elements of a Galois field.

BACKGROUND

Data communication systems comprise three basic components: a transmitter; a transmission channel; and a receiver. Transmitted data become altered due to noise corruption and channel distortion. To reduce the presence of errors caused by noise corruption and channel distortion, redundancy is intentionally introduced, and the receiver uses a decoder to make corrections. In modern data communication systems, the use of error correction codes plays a fundamental role in achieving transmission accuracy, as well as in increasing spectrum efficiency. Using error correction codes, the transmitter encodes the data by adding parity check information and sends the encoded data through the transmission channel to the receiver. The receiver uses the decoder to decode the received data and to make corrections using the added parity check information.

Binary Low Density Parity Check (LDPC) codes were first disclosed in R. G. Gallager: "*Low Density Parity Check Codes*", Cambridge, Mass.: MIT Press, 1963. However, due to their encoding and decoding complexity, these codes were ignored for over 30 years until MacKay revived interest in these codes in the late 90's. In D. MacKay: "Good error-correcting codes based on very sparse matrices", IEEE Trans. Inf. Theory, Vol. 45, No. 2, pp. 399-431, 1999, MacKay showed that LDPC codes have good performance approaching the Shannon limit for large block lengths.

In addition to using longer codes, performance of LDPC codes is also improved by using non-binary LDPC codes, capable of increasing the error correcting capability. Binary LDPC codes have parity check matrices with elements from a Galois Field GF(2) and use modulo-2 arithmetic, while non-binary LDPC codes are defined over GF(q). For example, reference M. Davey and D. MacKay: "Low-density parity check codes over GF(q)", IEEE Commun. Lett., Vol. 2, No. 6, pp. 165-167, 1998, has shown that non-binary LDPC codes have superior performance to binary codes with identical block length computed in bits.

In reference S. Sharifi Tehrani, W. Gross, and S. Mannor: "Stochastic decoding of LDPC codes", IEEE Commun. Lett., Vol. 10, No. 10, pp. 716-718, 2006, a binary LDPC decoder based on stochastic computing is disclosed. A major advantage of using a stochastic decoder is a substantially simplified circuitry.

It would be highly desirable to provide a decoding method and system for stochastic decoding of non-binary LDPC codes.

SUMMARY OF EMBODIMENTS OF THE INVENTION

According to one aspect, the invention provides for a method for stochastic processing of a set of encoded symbols comprising: a) receiving the set of encoded symbols, the set of encoded symbols being representative of a sequence of information bits and parity bits generated using a linear code with a parity check matrix, the parity check matrix comprising elements of a Galois field; b) determining for each encoded symbol a corresponding probability message; c) providing each probability message in a symbol-wise fashion to variable nodes of a logic circuitry, the logic circuitry comprising logic components forming the variable nodes, permutation nodes and parity check nodes, each of the variable nodes and the parity check nodes corresponding to a respective graphical variable node or graphical parity check node of a factor graph of the parity check matrix, the variable nodes and the parity check nodes of the logic components connected to each other in the same manner that the corresponding respective graphical variable nodes and graphical parity check nodes of the factor graph are connected, the permutation nodes being interposed between the variable nodes and the parity check nodes; d) passing each probability message in a symbol-wise fashion through the logic components and performing for each received symbol at the variable nodes the equality function, at the permutation nodes one of multiplication and division, and at the parity check nodes the parity check function, wherein the permutation nodes, and the parity check nodes perform Galois field operations, and wherein each of the variable nodes provides an output symbol in dependence upon each received symbol; e) if a variable node is in a hold state, providing a chosen symbol as the output symbol; and, f) repeating b) to e) until a stopping criterion is satisfied.

According to a further aspect, the invention provides for a stochastic decoder comprising: an input port for receiving a set of encoded symbols, the set of encoded symbols being representative of a sequence of information bits and parity bits generated using a linear code with a parity check matrix, the parity check matrix comprising elements of a Galois field; processing circuitry for generating a CDF of the symbols; logic circuitry in communication with the processing circuitry, the logic circuitry comprising logic components forming variable nodes, permutation nodes and parity check nodes, each of the variable nodes and the parity check nodes corresponding to a respective graphical variable node or graphical parity check node of a factor graph of the parity check matrix, the variable nodes and the parity check nodes of the logic components connected to each other in the same manner that the corresponding respective graphical variable nodes and graphical parity check nodes of the factor graph are connected the permutation nodes being interposed between the variable nodes and the parity check nodes, wherein the permutation nodes, and the parity check nodes are for performing Galois field operations, the logic circuitry for: determining for each encoded symbol a corresponding probability message; receiving each probability message in a symbol-wise fashion at a respective variable node; passing each probability message in a symbol-wise fashion through the logic components and performing for each received symbol at the variable nodes the equality function, at the permutation nodes one of multiplication and division, and at the parity check nodes the parity check function, wherein each of the variable nodes provides an output symbol in dependence upon each received symbol; and providing a chosen symbol from a variable node to a permutation node if the variable node is in a hold state output circuitry in communication with the logic circuitry for: receiving the output symbols from the variable nodes; determining if a stopping criterion has been satisfied;

and, determining an estimated sequence of information bits in dependence upon the output symbols.

BRIEF DESCRIPTION OF THE FIGURES

Exemplary embodiments of the invention will now be described in conjunction with the following drawings, in which.

DETAILED DESCRIPTION OF EMBODIMENTS OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

While embodiments of the invention will be described for non-binary LDPC codes for the sake of simplicity, it will become evident to those skilled in the art that the embodiments of the invention are not limited thereto, but are also applicable for decoding numerous other linear non-binary as well as binary codes with a parity check matrix comprising elements of a Galois field.

In the description hereinbelow mathematical terms such as, for example, "optimum" are used for clarity, but as is evident to one skilled in the art these terms are not to be considered as being strictly absolute, but to also include degrees of approximation depending, for example, on the application or technology.

Binary LDPC codes are defined as block codes characterized by a sparse M×N parity check matrix H. As a result of the sparseness of the parity check matrix H, the column and row weights are small, with the column and row weights each being a vector weight defined as the number of non-zero elements it contains. If all columns in the parity check matrix H have a same weight t, and all rows have a same weight $t_r$, the code is called regular. Since LDPC codes are block codes, they are encoded using a generator matrix G which satisfies $HG^T=0$. A codeword v is generated from a message u using v=uG. To check if a received vector x is a valid codeword, the syndrome vector $z=xH^T$ is determined. If z is a zero-vector, then x is a valid codeword; otherwise, the decoder attempts to correct it. Decoding of LDPC codes is performed using a belief propagation process, originally disclosed in R. G. Gallager: "*Low Density Parity Check Codes*", Cambridge, Mass.: MIT Press, 1963, and later refined by D. MacKay: "Good error-correcting codes based on very sparse matrices", IEEE Trans. Inf. Theory, Vol. 45, No. 2, pp. 399-431, 1999.

Figure 1:
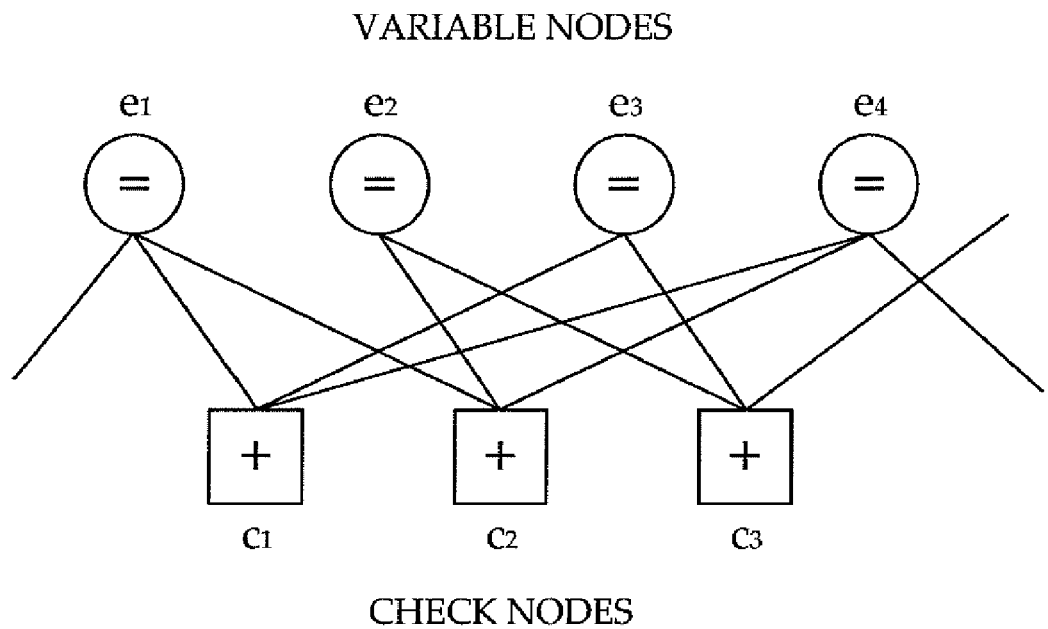
FIG. 1 is a simplified block diagram illustrating an example section of a bipartite graph used for decoding linear binary codes with a parity check matrix.

Current binary LDPC decoders are based on bipartite graphs, also known as factor graphs, to implement a belief propagation process. The graphs comprise two types of nodes: variable nodes, also known as equality nodes, and check nodes. FIG. 1 illustrates an example section of a bipartite graph. Received vector bits x correspond to the variable nodes and elements of z to check nodes. A connection between a variable node $e_i$ and a check node $c_j$ is made if the corresponding parity check element $H_{j,i}$ is non-zero. The row weight determines the number of variable nodes connected to a check node, called check node degree $d_c$, and the column weight determines the variable node degree $d_v$. In the ease of regular codes, both $d_v$ and $d_c$ are constants. Connected nodes exchange likelihood messages until all checks are satisfied or a predetermined number of iterations has been reached. The likelihood messages are determined in various ways, the simplest of which is the sum-product process.

The first step in the sum-product process is to initialize the variable nodes with a likelihood vector L based on the channel type and output signal. Let L[0] denote the likelihood of bit $x_i$ being a "0", and L[1] the likelihood of it being a "1". For example, for a binary input Additive White Gaussian Noise (AWGN) channel $$L[0] = \frac{1}{\sqrt{2\pi}\,\sigma} e^{\frac{(x+a)^2}{2\sigma^2}}$$

where a is the signaling element amplitude, x is the received bit's analog/continuous value, and $\sigma^2$ is the variance of the white Gaussian noise. For the same channel, $$L[1] = \frac{1}{\sqrt{2\pi}\,\sigma} e^{\frac{(x-a)^2}{2\sigma^2}}.$$

The messages from variable node $e_a$ to check node $c_b$ are denoted as $U_{ab}$, and the messages from $c_b$ to $e_a$ are denoted as $V_{ba}$.

The variable node update message is then:

$$U_{at} = L \times \prod_{c=1, c \neq t}^{d_V} V_{ca} \quad (1)$$

where × is a term-by-term product of vectors. The messages $U_{at}$ are probability density functions, therefore, they are normalized such that $$\sum_{i=0}^{1} U_{at}[i] = 1.$$

The check node update messages are the convolution of incoming probability densities:

$$V_{at} = \bigotimes_{v=1, v \neq t}^{d_C} U_{va} \quad (2)$$

where ⊗ is the convolution operator

Like binary LDPC codes, non-binary LDPC codes are defined by a sparse parity check matrix H. However, the elements of H are elements of a Galois field GF(q)—with q being, for example, defined as $q=2^p$—and the arithmetic is GF(q) arithmetic. Properties such as row and column weights and decodability over graphs hold true for non-binary LDPC codes.

For example, an element of a Galois field $GF(2^p)$ is represented using a polynomial $$i(x) = \sum_{l=1}^{p} i_l x^{l-1},$$

where $i_l$ are binary coefficients. In this case the field has a primitive generator polynomial p(x). For example, the likelihood messages are represented using tensors of size 2 and dimension p since it simplifies notation and operation representation. The initial likelihood vector L is then a tensor in the non-binary case indexed using the binary coefficients of $GF(2^p)$ elements. For example, L[0,1,1] corresponds to the likelihood of the received symbol being the GF(8) element represented by the polynomial $i(x)=x+x^2$.

While non-binary LDPC codes are also decoded using graphs, the decoding process is not a direct generalization of the binary case because the elements of the parity check matrix H are non-binary. As a result a check node represents the equation:

$$\sum_{k=1}^{d_c} h_k i_k(x) = 0 \quad (3)$$

where $h_k$ is the element of the parity check matrix H with indices corresponding to the respective check and variable nodes. This generalization is different from what a direct generalization of the check equation from the binary case would look like:

$$\sum_{k=1}^{d_c} i_k(x) = 0.$$

Figure 2:
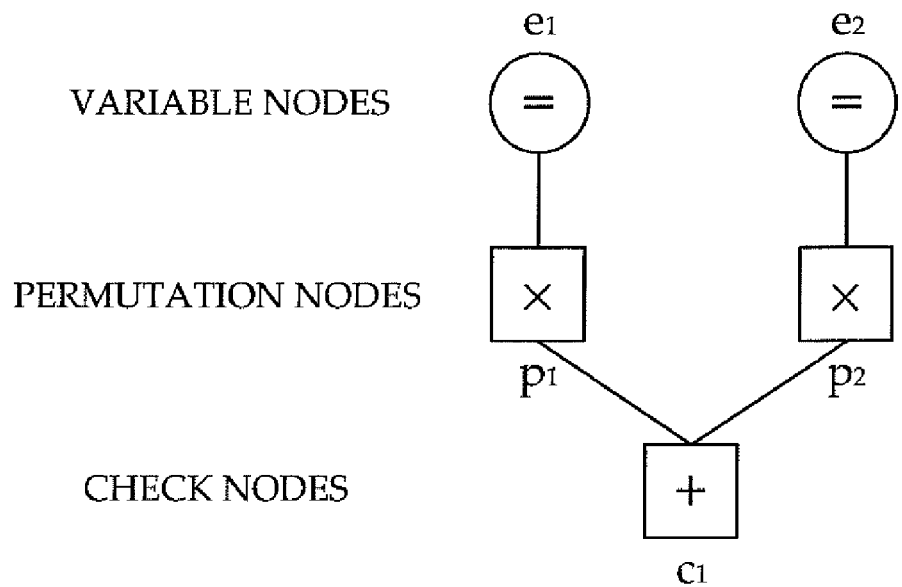
FIG. 2 is a simplified block diagram illustrating an example section of a bipartite graph comprising permutation nodes used for decoding linear non-binary codes with a parity check matrix.

To accommodate this change, a third node type, called a permutation node, is used which connects variable nodes and check nodes and performs multiplication, as shown in FIG. 2. Therefore, the check node equation is reverted to $$\sum_{k=1}^{d_c} j_k(x) = 0.$$

The first step is determination of the initial likelihood tensor using $$L[i_1, \ldots, i_p] = \prod_{k=1}^{p} l(i_k),$$

where $l(i_k)$ is the probability of bit k (the kth binary coefficient of the representation of the $GF(2^p)$ symbol) being "0" or "1", and is determined in similar fashion to the binary case. The variable node update message equation remains the same as equation (1) in the binary case, however, the messages are tensors and not vectors:

$$U_{at} = L \times \prod_{p=1, p \neq t}^{d_V} V_{pa} \quad (4)$$

where × is the term-by-term product of tensors. Normalization is also applied in the non-binary case such that $$\sum_{i_1, \ldots, i_p} U_{at}[i_1, \ldots, i_p] = 1.$$

The permutation nodes implement multiplication when passing messages from the variable nodes to the check nodes, and division when passing messages in the opposite direction. Since GF(q) are cyclic fields, the multiplication and division is performed by shifts of all values in a message except those indexed by 0. The equation corresponding to passing messages from variable to check nodes is written as:

$$\text{vec}(U_{pc}) = P_{h_a} \text{vec}(U_{vp}) \quad (5)$$

where $P_{h_a}$ is a q×q permutation matrix corresponding to the H matrix element $h_a$. The messages passed in the opposite direction are determined using $P_{h_a}^{-1}$.

Since the parity check equation does not include multiplication by elements of H, the check node update equation takes a similar form to equation (2) in the binary case:

$$V_{at} = \sum_{i_c(x) \Sigma_c^{d_c} i_c(x) = 0} \prod_{p=1, p \neq t}^{d_c} U_{pa}[i_{c_1}, \ldots, i_{c_p}] = \bigotimes_{p=1, p \neq t}^{d_c} U_{pa} \quad (6)$$

References S. Sharifi Tehrani, W. Gross, and S. Mannor: "Stochastic decoding of LDPC codes", IEEE Commun. Lett., Vol. 10, No. 10, pp. 716-718, 2006, and U.S. patent application Ser. No. 11/902,410 filed September 2007, disclose a binary LDPC decoder based on stochastic computing An advantage of using a stochastic decoder is simplified circuitry. For example, an XOR gate is used for determining an outgoing message of a degree 3 check node.

In a stochastic decoder, likelihood values are used to generate sequences of symbols where the number of occurrences of a particular symbol with the sequence corresponds to its likelihood values in a non-stochastic decoder. For example, if the symbol "1" appears eight times in a sequence of a hundred symbols, its likelihood is 0.08. When describing stochastic messages, s denotes the iteration number. For example, $U_{vp}(s)$ is the stochastic message symbol from variable node v to permutation node p at iteration s.

The variable node is similar to the one in the case of the binary LDPC decoder disclosed in S. Sharifi Tehrani, W. Gross, and S. Mannor: "Stochastic decoding of LDPC codes", IEEE Commun. Lett., Vol. 10, No. 10, pp. 716-718, 2006, with the difference being that the variable node in the non-binary case is operated at a symbol level instead of a bit level. If all inbound messages are equal, including the channel stochastic message C(s), the outgoing message is set to be equal to these messages. Otherwise, the outgoing message retains its previous value. Therefore, the update message for the variable node is:

$$U_{at}(s) = \begin{cases} V_{pa}(s) & \text{If } V_{pa}(s) \text{ and } C(s) \text{ are equal for all } p \neq t \\ U_{at}(s-1) & \text{Otherwise} \end{cases} \quad (7)$$

The permutation node implements GF(q) multiplication and division (multiplication by the inverse). When passing a message from variable node $e_i$ to check node $c_j$, the permutation node multiplies that message by H(j, i), and divides by the H elements when passing messages in the reverse direction. In stochastic arithmetic the multiplication and division are implemented directly.

Since permutation nodes are used to perform the multiplication or division of messages with non-zero H elements, the check node directly implements the check constraint and its message update equation is given by:

$$V_{at}(s) = \sum_{p \neq t} U_{pa}(s) \quad (8)$$

where the summation is GF(q) addition. In the binary case, GF(2) addition is an XOR operation. Thus the non-binary check node reduces to the binary one for GF(2).

The three types of nodes, variable node, permutation node, and check node, are, for example, implemented using circuitry described hereinbelow for the case of elements of $GF(2^p)$ fields being represented by their polynomial coefficients, but is not limited thereto. For example, in GF(4), element $\alpha = x$ is represented as [1, 0] and $\alpha^2 = 1 + \alpha = 1 + x$ is represented as [1, 1].

Figure 3:
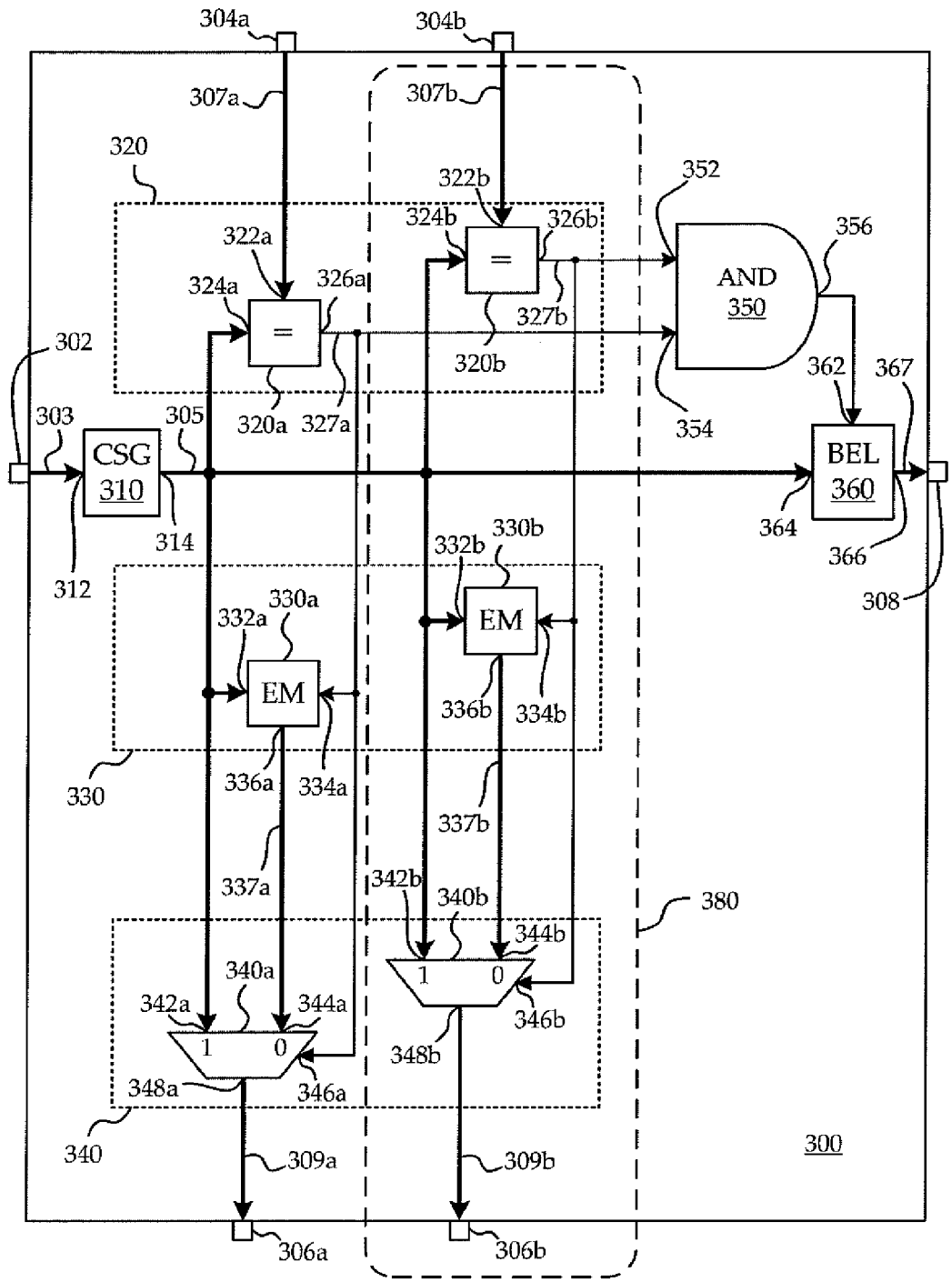
FIG. 3 is a simplified block diagram illustrating circuitry of a variable node used in a stochastic decoder for decoding linear non-binary codes with a parity check matrix according to embodiments of the invention.

With reference to FIG. 3, implementation of the operation specified in equation (7) in a variable node circuit 300 according to a one embodiment will now be discussed with respect to its structure.

The variable node circuit 300 comprises a channel stream generator (CSG) 310 a belief tracker 360, an AND unit 336, a bank of equality check units 320, a bank of edge memory units 330, and a bank of multiplexers 340. The bank of equality check units 320 includes a number of equality check units 320a, 320b, the bank of edge memory units 330 includes a number of edge memory units 330a, 330b, and the bank of multiplexers 340 includes a number of multiplexers 348a, 348b. The number of equality check units, edge memory units, and multiplexers each equal the degree of the graphical variable node implemented by the variable node circuit 300, and equals the number of permutation node circuits the variable node circuit 300 is connected to. The number of permutation node circuits a variable node circuit is connected to will be referred to as the degree (D) of the variable node circuit 300.

The variable node circuit 300 has a cumulative distribution function (CDF) input 302 for receiving a cumulative distribution function (CDF), a total of D*(D−1) p-bit wide permutation node inputs 304a, 304b, a total of D p-bit wide permutation node outputs 306a, 306b, and a p-bit wide symbol belief output 308. The variable node circuit 300 illustrated in FIG. 3 is a degree two variable node circuit and hence has D*(D−1)=2*(2−1)=2 permutation node inputs and D=2 permutation node outputs.

The cumulative distribution function (CDF) input 302 of the variable node circuit 300 is connected over an input bus 303 to a cumulative distribution function (CDF) input 312 of the CSG 310. A p-bit wide channel stream bus 305 connects a channel stream output 314 of the CSG 310 to the bank of equality check units 320, the bank of edge memory units 330, the bank of multiplexers 340, and the belief tracker 360.

Each equality check unit 320a, 320b of the bank of equality check units 320 has a p-bit wide channel stream input 324a, 324b connected to the channel stream bus 305, a permutation node input 322a, 322b connected via a respective p-bit wide permutation node input bus 307a, 307b to respective permutation node inputs 304a, 304b of the variable node circuit 300. Each equality check unit 320a, 320b also has an equality signal output 326a, 326b connected over a respective equality output line 327a, 327b to a respective edge memory unit 330a, 330b, and a respective multiplexer 340a, 340b.

Each edge memory unit 330a, 330b of the bank of edge memory units 330 has a p-bit wide channel stream input 332a, 332b connected to the channel stream bus 305, a respective p-bit wide output 336a 336b for output over an edge memory unit output bus 337a, 337b to a respective multiplexer 340a, 340b. Each edge memory unit 330a, 330b also has an equality signal input 334a, 334b connected to a respective equality output line 327a, 327b. Each edge memory unit is a finite depth buffer used to alleviate the latching problem as discussed below.

Each multiplexer 340a, 340b of the bank of multiplexers 340 has a p-bit wide channel stream input 342a, 342b connected to the channel stream bus 305, a respective p-bit wide input 344a, 344b for input from a respective edge memory unit 330a, 330b over a respective edge memory unit output bus 337a, 337b, and a respective p-bit wide multiplexer output 348a, 348b for output over a respective permutation node output bus 309a, 309b to a respective permutation node output 306a, 306b of the variable node circuit 300. Each multiplexer 340a, 340b also has an equality signal input 346a, 346b connected to a respective equality output line 327a, 327b.

The AND unit 350 has a number of inputs 352, 354, each of which is connected to a respective equality output line 327a, 327b, and which number is equal to the degree D of the variable node circuit 300. The AND unit 350 also has an update signal output 356 connected to the belief tracker 360.

The belief tracker 360 has a channel stream input 364 connected to the channel stream bus 305, an update signal input 362 connected to the update signal output 356 of the AND unit 350 and a belief output 366 connected over a belief output bus 367 to the belief output 308 of the variable node circuit 300.

It should be noted that for each permutation node circuit that the variable node circuit 300 is connected to, there is in the variable node circuit 300 a respective external node transaction circuit, comprised of the various elements between the permutation node input 304a, 304b, and respective permutation node output 306a, 306b of the variable node circuit 300. For example, external node transaction circuit 380 is comprised of a respective permutation node input bus 307b, equality check unit 320b, equality output line 327b, edge memory unit 330b, edge memory unit output bus 337b, multiplexer 340b, multiplexer output bus 309b, and permutation node output 306b It should be noted that the external node transaction circuit 380 receives input from all but one permutation node and sends output to only one permutation node. FIG. 3 specifically depicts a D=2 variable node circuit. It should be understood that a degree D variable node will have D permutation node inputs and will include D external node transaction circuits each of which will have a single permutation node output, and D−1 permutation node inputs. It should be noted that, of the permutation node circuits the variable node circuit is connected to, the single permutation node circuit receiving output from a particular external node transaction circuit will be the only permutation node circuit which is not connected over a permutation node input to that particular external node transaction circuit. So for example if a variable node circuit a is connected to permutation node circuits j,k,l, and m, the external node transaction circuit providing output to permutation node k will only be connected to permutation node inputs connected to permutation node circuits j,l, and m. A variable node circuit of degree D, will have external node transaction circuits each of which has an equality check unit which has D−1 permutation node inputs connected via D−1 permutation node input buses to D−1 of the permutation input nodes of the variable node circuit 300.

The variable node circuit 300 will now be discussed with respect to its function. The variable node circuit 300 accepts two kinds of input: input from permutation nodes circuits over its permutation node inputs 304a, 304b and the cumulative distribution function over its CDF input 302. The variable node receives the CDF input at the beginning of the decoding of a newly received codeword, and receives input from permutation node circuits every decoding cycle.

The cumulative distribution function (CDF) is generated from the channel likelihood values calculated for the $GF(2^p)$ symbol of the received codeword corresponding to the particular variable node and is used is used by the variable node circuit 300 to generate a stochastic stream of $GF(2^p)$ symbols. The CDF comprises a set of $2^p$ values each t-bits in length, each CDF value delimiting a range of t-bit values, the relative span of the range corresponding to a relative likelihood that the received codeword symbol is a particular $GF(2^p)$ symbol. Optionally, only $(2^p-1)$ CDF values are used, to separate the possible t-bit numbers into $2^p$ ranges. Generation of the CDF is discussed further below.

The CDF values are input over the input bus 303 to the CSG 310. Each CDF value is associated with a particular $GF(2^p)$ symbol and represents an upper limit of the relative range of possible values for a t-bit number corresponding to the $GF(2^p)$ in the sense which follows. To generate the stochastic stream of $GF(2^p)$ symbols, every decoding cycle the CSG 310 generates a random t-bit number and compares it with the stored CDF values. The $GF(2^p)$ symbol corresponding to the lowest CDF value which is equal to or greater than the random t-bit number is used as the next $GF(2^p)$ symbol of the stochastic stream. Optionally, the random t-bit value is generated using a linear feed-back shift-register (LFSR). For efficiency, the random t-bit value is compared with the CDF values in ascending order. In this case, the $GF(2^p)$ symbol corresponding to the first CDF value which is equal to or greater than the random t-bit number is used to as the next $GF(2^p)$ symbol of the stochastic stream.

Once the particular $GF(2^p)$ symbol is determined it is output from the channel stream output 314 of the CSG 310 over the channel stream bus 305. It should be clear that a bus width of p-bits for the channel stream bus 305 is appropriate for $GF(2^p)$ symbols which may be represented by p single-bit coefficients $i_k$. A new $GF(2^p)$ symbol is generated in this manner every decoding cycle.

Each decoding cycle, each external node transaction circuit 380 receives a channel stream symbol over the channel stream bus 305 and D−1 permutation node symbols (in this case one symbol) over permutation node input(s) 304b of the variable node circuit 300. The permutation node input symbol traverses the permutation node input bus 307b to the permutation node input 322b of the equality check unit 320b. The equality check unit 320b checks the permutation node input symbol for equality with the channel stream symbol in a bit-wise manner. If the two symbols are equal, the equality check unit 320b outputs from its equality signal output 326b to the equality output line 327b an equality value representing that the values are equal. If the two symbols are not equal, the equality check unit 320b outputs from its equality signal output 326b to the equality output line 327b an inequality value representing that the values are not equal. In the case of D>2, the equality check unit 320b checks all of the received symbols for bit-wise equality.

The edge memory unit 330b receives over its channel stream input 332b the channel stream symbol and receives over its equality signal input 330b the equality or inequality value. If the edge memory unit 330b receives an equality value over its equality signal input 330b, then the channel stream symbol is added to the edge memory unit 330b. If the edge memory unit 330b receives an inequality value over its equality signal input 330b, then the channel stream symbol is discarded and a symbol is randomly or pseudo-randomly selected from the edge memory unit 330b and sent via the edge memory unit output bus 337b to the multiplexer 340b.

The edge memory units (EMs) are used to alleviate the latch-up problem by breaking correlation between stochastic messages. Since the latch-up problem is more pronounced in the stochastic decoding of non-binary codes, EMs substantially improve the performance of non-binary stochastic decoders. EMs are finite depth buffers, and due to the EMs' finite length, older messages are discarded when new ones are stored.

The multiplexer 340b receives over its channel stream input 342b the channel symbol and over its equality signal input 346b the equality or inequality value. If the multiplexer 340b receives over its equality signal input 346b the equality value, it switches its multiplexer output 348b to output what is received over the channel stream input 342b and hence outputs the channel stream symbol through its multiplexer output 348b over the permutation node output bus 309b and through the permutation node output 306b of the variable node circuit 300 to the permutation node circuit the permutation node output 306b is connected to. If the multiplexer 340b receives over its equality signal input 346b the inequality value, it switches its multiplexer output 348b to output what is received over the p-bit wide input 344b and hence outputs the randomly selected symbol of the edge memory unit 330b through its multiplexer output 348b over the permutation node output bus 309b and through the permutation node output 306b of the variable node circuit 300 to the permutation node circuit the permutation node output 306b is connected to.

The AND unit 350 receives over its inputs 352, 354, signals from each of the equality output lines 327a, 327b and generates an update signal for sending over its update signal output 356 to the belief tracker 360. When the AND unit 350 receives over every equality output line 327a, 327b the equality value, the AND unit 350 generates an "update" value from its update signal output 356. When the AND unit 350 receives over any one of the equality output lines 327a, 327b the inequality value, the AND unit 350 generates a "no update" value from its update signal output 356. As such, update conditions only occur when all received symbols and the channel stream symbol are equal and the converse occurs if any of the received symbols or the channel stream symbol do not equal any of the others.

The belief tracker 360 tracks a belief value representing one particular symbol of the $2^p$ possible $GF(2^p)$ symbols. This belief is stored in a $2^p$-bit belief vector in the belief tracker 360, and corresponds to the $GF(2^p)$ symbol which was obtained from the channel stream bus 305 the most number times under "update" conditions. The belief tracker 360 stores, for each possible $GF(2^p)$ symbol, a count of how many of those symbols were received from the channel stream bus 305 under update conditions. Optionally, these counts are performed and maintained by up-counters, one for each possible $GF(2^p)$ symbol.

The belief tracker 360 receives over its channel stream input 364, the channel stream symbol from the channel stream bus 305, and receives over its update signal input 362 the "update" or "no update" value. If the belief tracker 360 receives the "no update" value over its update signal input, the belief tracker 360 discards the channel stream symbol. If the belief tracker 360 receives the "update" value over its update signal input, the belief tracker 360 accepts the current channel stream symbol over its channel stream input 364. The belief tracker 360 then identifies which particular one of the $2^p$ $GF(2^p)$ symbols it has received, and updates the counter associated with that particular symbol. The belief tracker 360 then reassesses which one of the symbols currently has the most number of counts, and updates the belief stored in the belief vector if the count associated with the current channel stream symbol is larger than the count associated with the symbol to which the currently stored belief in the belief vector corresponds.

The belief vector identifying the symbol having the highest count in the belief tracker is available through belief output 366, over the p-bit belief output bus 367, and out the belief output 308 of the variable node circuit 300.

Figure 4:
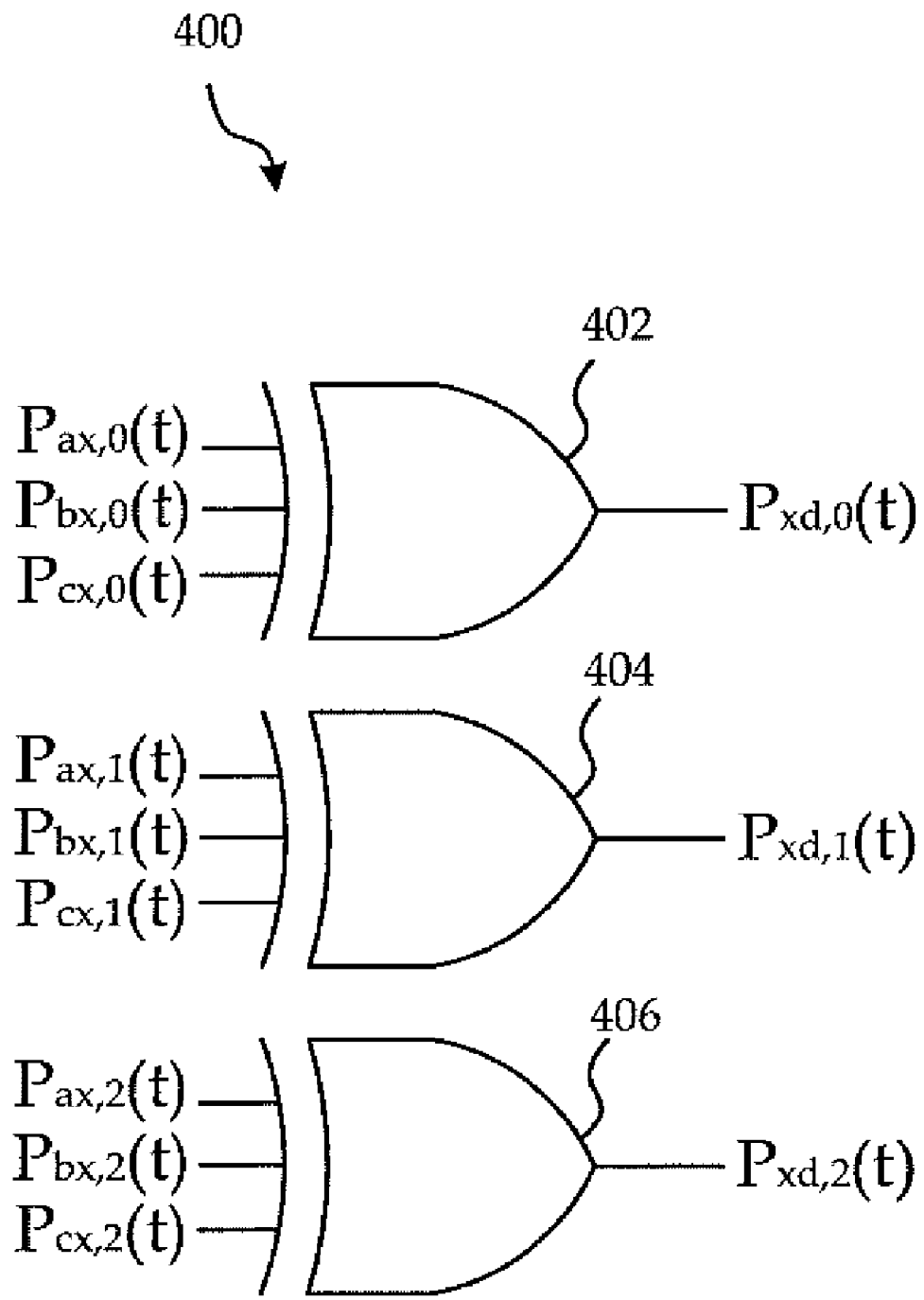
FIG. 4 is a simplified block diagram illustrating circuitry of a parity check node used in a stochastic decoder for decoding linear non-binary codes with a parity check matrix according to embodiments of the invention.

Permutation nodes are implemented using GF(q) multipliers. For a given node, the messages arriving at a permutation node are always multiplied by the same element of H. As a result the multiplier is designed to multiply by a specific constant element of the GF(q) field instead of a generic GF(q) multiplier. This reduces circuit complexity and reduces the area used for implementing the decoder. The division for messages passed in the opposite direction is implemented, for example, by multiplying the inverse of a predetermined H element The circuit illustrated in FIG. 4 is an example of a degree 4 check node 400 in GF(8). The outgoing messages from the check nodes are GF(q) summations of incoming messages. This operation is realized utilizing GF(q) adders, for example for $GF(2^p)$, XOR operations 402, 404, 406 between corresponding bit lines of messages. To implement a higher degree check node, the number of input ports to each XOR gate is increased to account for extra incoming messages. For extending the circuit shown in FIG. 4 to higher order Galois Fields more XOR gates are added accordingly. $P_{km,j}(t)$ denotes the jth bit representing a GF(4) symbol passed from permutation node k to variable check node m at iteration (time) t.

Cycles in the factor graph cause messages to become correlated and significantly reduce the switching activity, thus, lowering performance substantially. Furthermore, for higher order Galois fields, the variable node update condition is rarely satisfied resulting in substantial performance degradation. There are two solutions available to overcome these problems: Noise-Dependent Scaling (NDS) and Edge Memories (EM). Edge memories may be implemented in the variable nodes themselves as described above, or may be used external to the variable nodes, as described below in association with an alternative embodiment.

NDS increases the switching activity by scaling, up or down, the likelihood values. For example when transmitting data using Binary Phase Shift Keying (BPSK) modulation over an AWGN channel the scaled likelihood of each received bit l'(i) is calculated as:

$$l'(i) = [l(i)]^{\frac{2\alpha\sigma_n^2}{\gamma}}$$

where l(i) is the unsealed bit likelihood, $\sigma_n^2$ is the noise variance, and the ratio α/y is determined, for example, using simulations to yield an optimum performance.

The stochastic decoding process of non-binary LDPC codes comprises the following steps:
1) The EMs are initialized and normalized using scaled channel likelihood values as Probability Mass Functions (PMF) (or as described above cumulative distribution functions CDF) for their content distribution.
2) Variable node messages are determined using equation (7), EMs are updated where appropriate, and messages are sent from EMs to respective permutation nodes.
3) Permutation nodes perform GF(q) multiplication on incoming messages and send resulting messages to respective check nodes.
4) Check node messages are determined according to equation (8) and sent to respective permutation nodes.
5) Permutation nodes perform GF(q) division on incoming messages and send results to respective variable nodes.
6) Variable node beliefs are updated based on incoming messages and channel messages C.
7) Steps 2-6 are repeated a predetermined number of iterations, or until the check constraints are satisfied.

Once the predetermined number of iterations are finished or the check constraints are satisfied, the counter values in the variable nodes are used to determine detected symbols.

Figure 5:
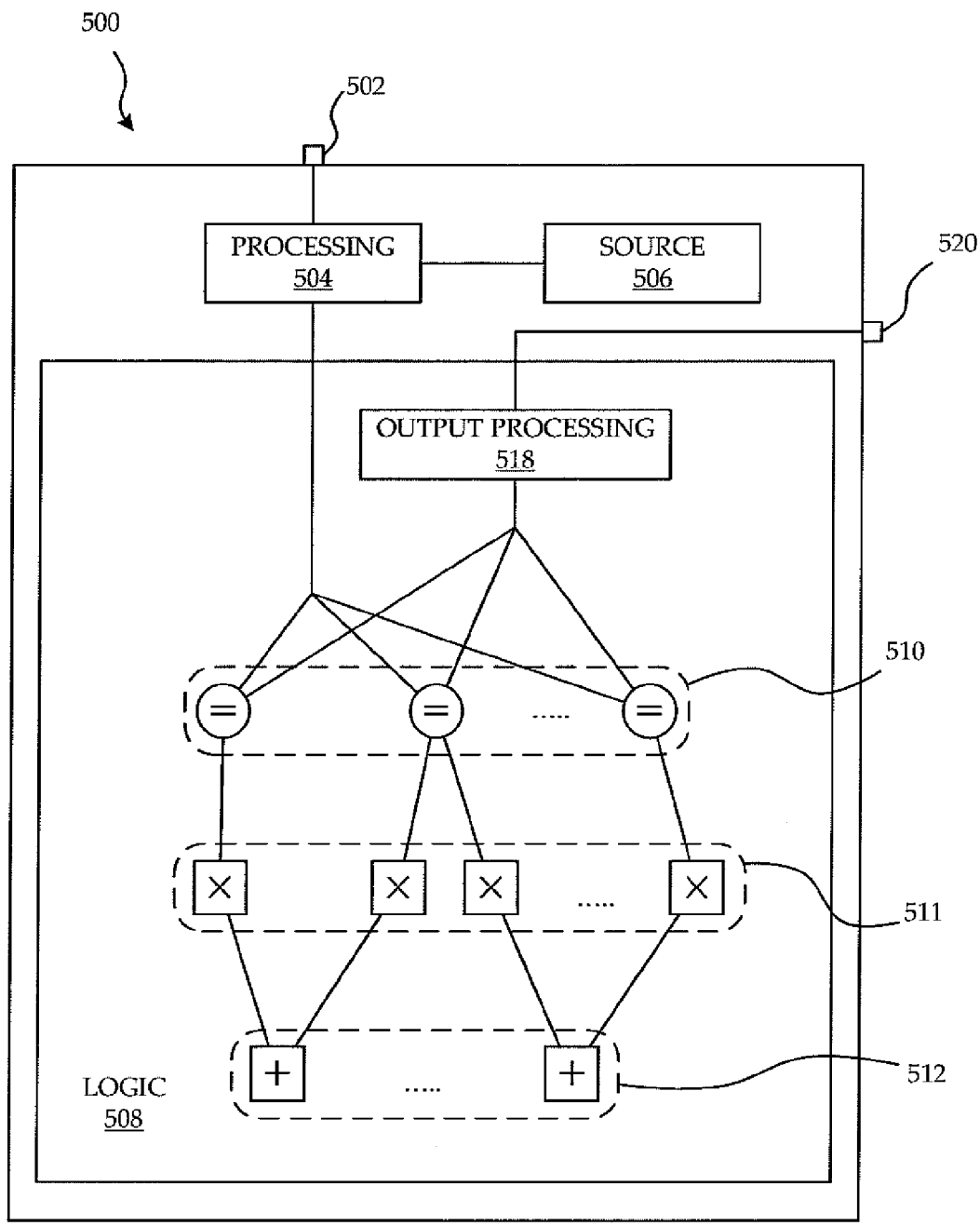
FIG. 5 is a simplified block diagram of a stochastic decoder according to an embodiment of the invention.
Figure 6A:
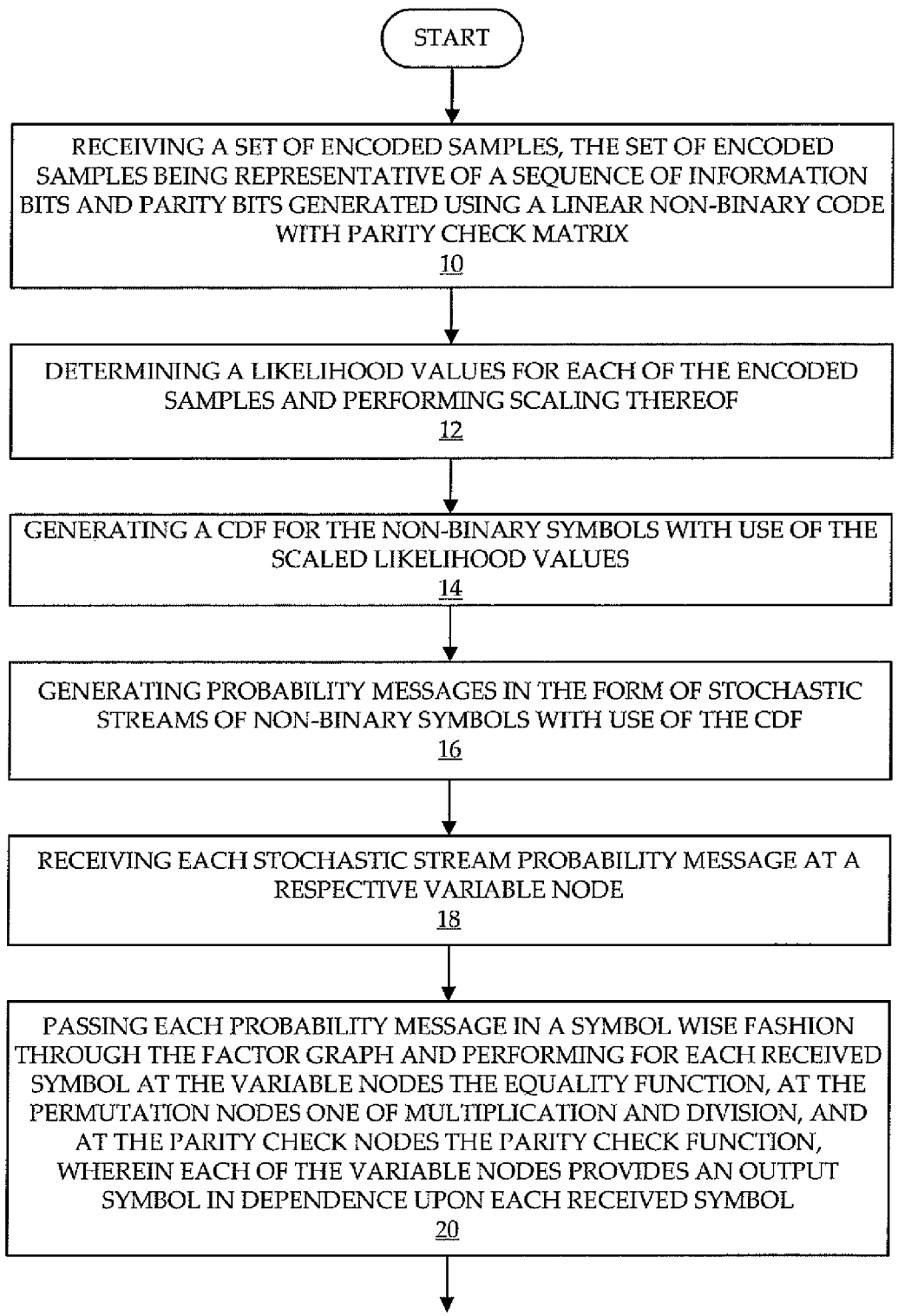
FIG. 6A and 6B is a simplified flow diagram of a method for stochastic decoding according to an embodiment of the invention for execution on the stochastic decoder shown in FIG. 5.
Figure 6B:
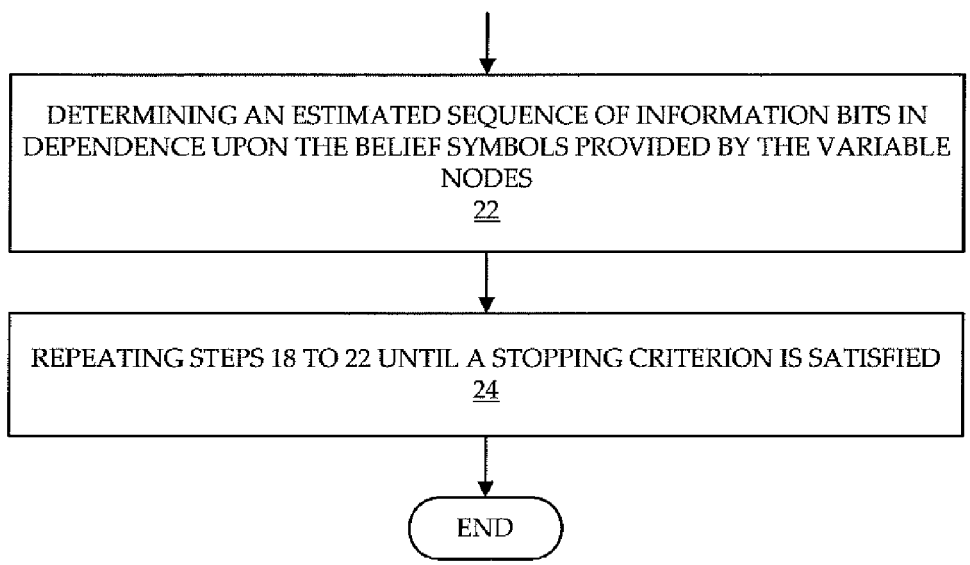

The stochastic decoding of linear non-binary codes with a parity check matrix described above is, for example, implemented using a stochastic decoder 500 according to an embodiment of the invention, as shown in FIG. 5, while FIG. 6A and 6B is a simplified flow diagram of a method for stochastic decoding according to an embodiment of the invention for execution on the stochastic decoder 500.

The stochastic decoder 500 comprises: an input port 502, processing circuitry 504 connected to the input port 502, source circuitry 506 connected to the processing circuitry 504, logic circuitry 508 connected to the processing circuitry 504, output processing 518 connected to the various logic circuitry elements, and an output port 520 connected to the output processing 518. In operation, and with specific reference to the method steps illustrated in FIG. 6A and 6B, a set of encoded samples is received in step 10 at the input port 502 for decoding. The set of encoded samples is representative of a sequence of information bits and parity bits generated using a linear non-binary code with a parity check matrix such as a non-binary LDPC code where each element of the matrix is a non-binary element. Upon receipt, the processing circuitry 504 determines, the likelihood of each bit in step 12. Optionally, the processing circuitry 504 scales in step 12 each of the encoded samples by a scaling factor, for example, a noise dependent scaling factor. The scaling factor is determined such that switching activity in the stochastic decoder 500 is increased. From the bit-wise likelihood values, the likelihood tensor for each possible symbol is calculated and normalized and used to generate a CDF for all possible symbols in step 14. The logic circuitry 508 comprises logic components forming variable nodes 510, permutation nodes 511, and parity check nodes 512. The CDF values are calculated and sent to the variable nodes at the beginning of the decoding of a new codeword and are computed from the channel likelihood values for each possible symbol. The $L[i_1, \ldots, i_p]$ tensor discussed above, is used to generate a set of $2^p$ likelihood values, each being the likelihood that the $GF(2^p)$ symbol of the codeword is a particular $GF(2^p)$ symbol. In step 16 the variable nodes generate a stochastic stream of $GF(2^p)$ symbols, this corresponds to probability messaging on the basis of symbol frequency within the sequence of symbols. Such a stream of $GF(2^p)$ symbols is alternatively referred to as a probability message and is a generalization of a stochastic binary probability message made of 1s and 0s. As described above the variable node generates the stochastic stream of channel stream symbols in a pseudo-random or random fashion from the CDF. Each permutation node 511 is, for example, a Galois field multiplier for multiplying the messages received from one of the variable nodes 510 by a predetermined constant element of the parity check matrix H and for multiplying the messages received from the parity check nodes 512 by the inverse of the predetermined constant element of the parity check matrix H. Each parity check node 512 comprises, for example, a predetermined number of XOR gates with the number of XOR gates being determined in dependence upon the order of the Galois field. The variable nodes 510 and the parity check nodes 512 are connected such that they implement a factor graph of the parity check matrix, with the permutation nodes 511 being interposed between the variable nodes 510 and the parity check nodes 512. In step 18, each probability message is received in a symbol-wise fashion at a respective variable node 510 (although in some embodiments the variable node also generates the probability message) and is then passed in step 20 in a symbol-wise fashion through the factor graph while for each symbol the equality function is performed at the variable nodes 510, multiplication is performed at the permutation nodes 511, and the parity check function is performed at the parity check nodes 512.

The above steps 18 to 22 are repeated until a stopping criterion is satisfied in step 24. The stopping criterion is, for example, a predetermined number of DCs unless $H\hat{x}=0$ is satisfied, with H being the parity check matrix and $\hat{x}$ being the estimated symbol codeword determined in dependence upon the belief symbols provided by the variable nodes 510. The steps 22 and 24 are performed using output processing circuitry 518 or, alternatively, processing circuitry 504. The estimated sequence $\hat{x}$ satisfying the criterion $H\hat{x}=0$ or being obtained after the predetermined number of DCs is then provided to the output port 520.

Figure 7:
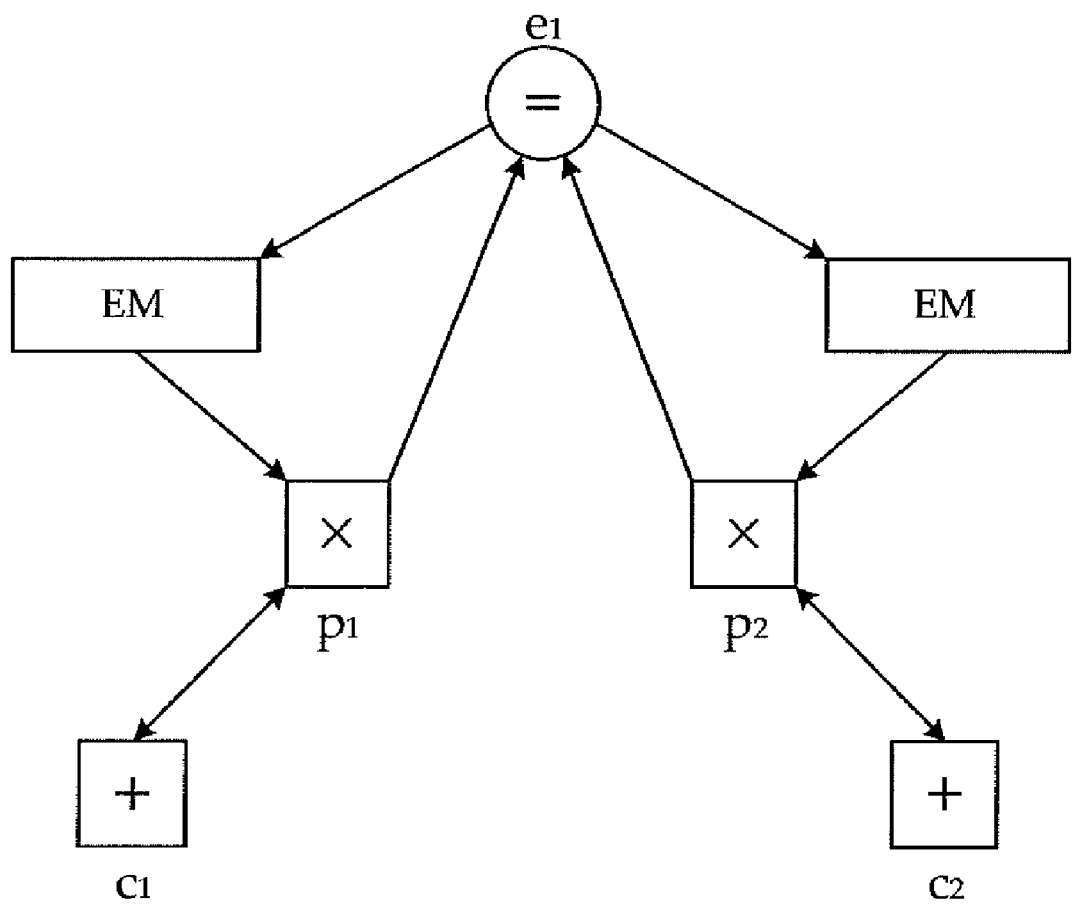
FIG. 7 is a simplified block diagram illustrating an example section of a bipartite graph comprising edge memories external to the variable nodes for decoding linear non-binary codes with a parity check matrix according to alternative embodiments of the invention.
Figure 8:
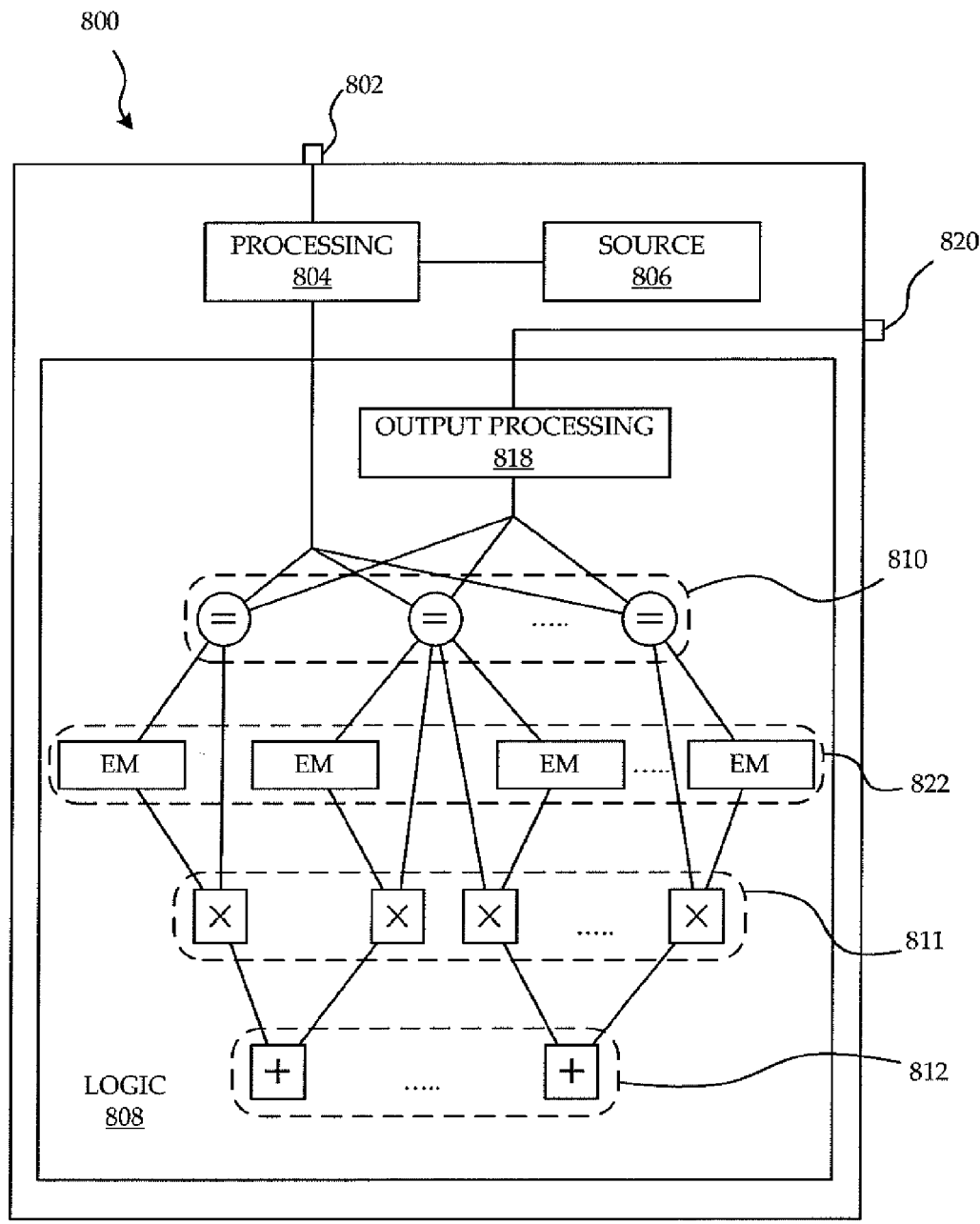
FIG. 8 is a simplified block diagram of a stochastic decoder according to an alternative embodiment of the invention.

Although from an implementation point of view it is preferable to incorporate the hold state or latching alleviating function into the variable node circuits 300 with use of the edge memory units 330 and the multiplexers 340, optionally, in an alternative embodiment, the edge memory units are not located inside variable node circuits, but are instead outside the variable node circuits. In such a case, and as shown in FIGS. 7 and 8 illustrating an alternative embodiment of a stochastic decoder 800, these external EMs are disposed between the variable nodes and the permutation nodes would handle the output selection function performed by a multiplexer 340x in the above described embodiments. These functions would be implemented in second source circuitry, interposed in the logic circuitry 808 at predetermined locations and in communication with the variable nodes 810. The second source circuitry is interposed for providing a chosen symbol if a respective variable node 810, or a group of variable nodes 810, is in a hold state. The second source circuitry comprises, for example, a plurality of edge memories (EMs) 822 with each EM being connected to a respective variable node 810 at each connection from the variable node 810 to a respective permutation node 811. For example, each EM 822 comprises a shift register such as an M-bit shift register with M being an integer number of approximately 100. Each EM 822 stores output symbols of the respective variable node 810 when the respective variable node 810 is in a state other than a hold state and provides one of the stored symbols when the respective variable node 810 is in a hold state. As with the embodiments described hereinabove, this updating process reduces the chance of locking a variable node 810 into a fixed state because when a hold state occurs, a symbol is chosen from the previous output symbols which are not produced in a hold state. It is to be understood that the other components of the stochastic decoder 800 of the alternative embodiment are the same and function the in the same manner as those similarly numbered and described in association with FIG. 5.

Figure 9:
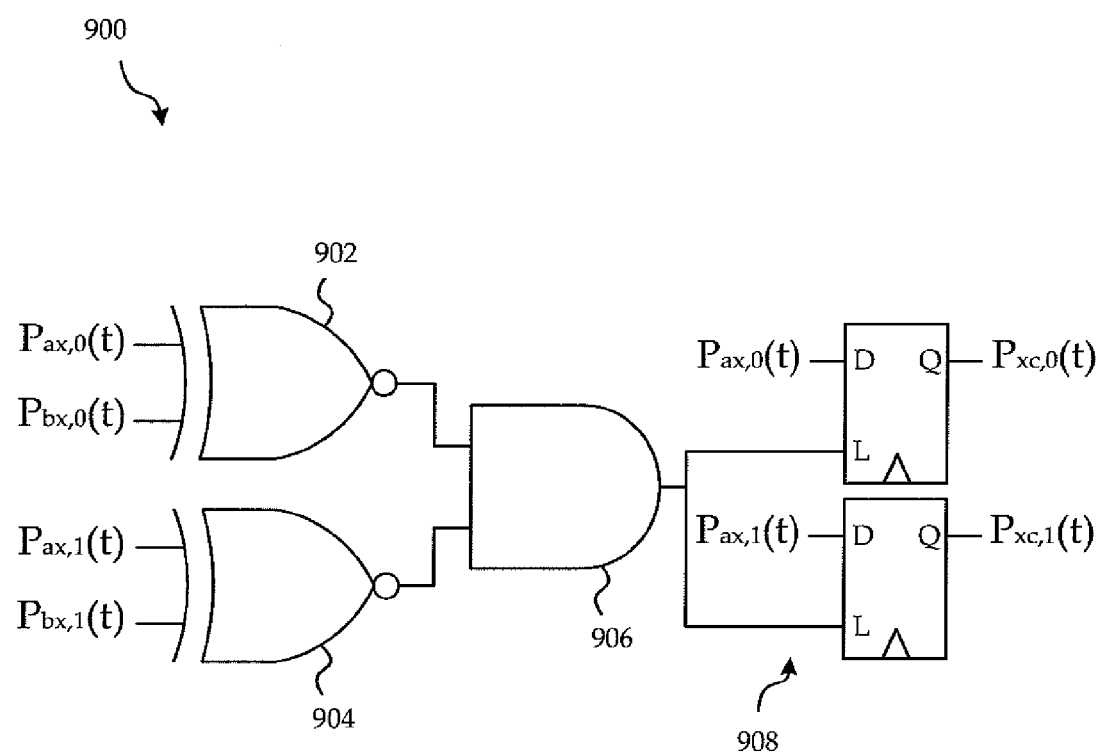
FIG. 9 is a simplified block diagram illustrating circuitry of an alternative variable node used in a stochastic decoder for decoding linear non-binary codes with a parity check matrix according to an alternative embodiment of the invention.

With reference to FIG. 9, an alternative implementation of the variable node (implementing equation 7), and one in which the EMs are implemented outside the variable node as described in association with FIGS. 7 and 8, will now be discussed. The equality check circuit 900 compares incoming messages as a whole and with use of a D flip-flip, uses their value if they are equal or keeps the previous value if they differ. This particular equality check circuit 900 is for a degree two variable node x in GF(4) and comprises two XNOR gates 902, 904 and an AND gate 906 are used to provide an enable (latch) signal to a D flip-flop 908.

To extend the circuit of FIG. 9 to a higher order Galois field, more XNOR gates are used accordingly and connected to a larger AND gate for accommodating the increase in the number of bits used to represent each message. For higher degree nodes, the number of input ports to each XNOR gate is increased.

In the alternative embodiment depicted in FIG. 9, the functions performed by the belief tracker in the other embodiments is performed by output processing 818.

In the description hereinabove and in the claims which follow, the same terms sometimes are used to describe different although corresponding elements of the factor graph, the LDPC algorithms, and the circuits implementing the LDPC algorithms. One example of such a term is "variable node", which may be used to describe an object of a factor graph, part of an algorithm, or a component of an apparatus. It shall be evident to one skilled in the art which particular meaning is to be ascribed to each appearance of such a term from the particular manner of the term's usage and the context in which the term appears. For clarity, the terms "graphical variable node" and "graphical parity check node" are references to, respectively, a variable node and a parity check node of the factor graph.

Although a cumulative distribution fiction (CDF) has been described above as being used to determine the generation of the stochastic stream of channel symbols, a probability density function (PDF) may alternatively be used although this complicates the calculations performed by the CSG.

Numerous other embodiments of the invention will be apparent to persons skilled in the art without departing from the spirit and scope of the invention as defined in the appended claims.

What is claimed is:

1. A method for stochastic processing of a set of encoded symbols comprising:
   a) receiving the set of encoded symbols, the set of encoded symbols being representative of a sequence of information bits and parity bits generated using a linear code with a parity check matrix the parity check matrix comprising elements of a Galois field;
   b) determining for each encoded symbol a corresponding probability message;
   c) providing each probability message in a symbol-wise fashion to variable nodes of a logic circuitry, the logic circuitry comprising logic components forming the variable nodes, permutation nodes and parity check nodes, each of the variable nodes and the parity check nodes corresponding to a respective graphical variable node or graphical parity check node of a factor graph of the parity check matrix, the variable nodes and the parity check nodes of the logic components connected to each other in the same manner that the corresponding respective graphical variable nodes and graphical parity check nodes of the factor graph are connected, the permutation nodes being interposed between the variable nodes and the parity check nodes;
   d) passing each probability message in a symbol-wise fashion through the logic components and performing for each received symbol at the variable nodes the equality function, at the permutation nodes one of multiplication and division, and at the parity check nodes the parity check function, wherein the permutation nodes, and the parity check nodes perform Galois field operations, and wherein each of the variable nodes provides an output symbol in dependence upon each received symbol;
   e) if a variable node is in a hold state, providing a chosen symbol as the output symbol; and,
   f) repeating b) to e) until a stopping criterion is satisfied.

2. The method as defined in claim 1 further comprising:
   determining an estimated sequence of information bits in dependence upon the output symbols provided by the variable nodes.

3. The method as defined in claim 1 wherein step e) comprises choosing a symbol from previous output symbols of the variable node stored in a corresponding memory, the previous output symbols being provided by the variable node in a state other than the hold state.

4. The method as defined in claim 3 wherein the symbol is chosen in one of a pseudo-random and random fashion.

5. The method as defined in claim 3 wherein step e) comprises updating the memory when the variable node is in a state other than the hold state.

6. The method as defined in claim 3 further comprising:
   initializing the corresponding memory using channel likelihood values as probability mass functions for content distribution.

7. The method as defined in claim 3 wherein step d) comprises:
   d1) determining variable node messages and sending the variable node messages via the corresponding memories to the respective permutation nodes;
   d2) using the permutation nodes, performing multiplication on the messages and sending resulting messages to the respective parity check nodes;
   d3) determining parity check messages by performing a parity check on the resulting messages and sending the parity check messages to permutation nodes;
   d4) using the permutation nodes, performing division on the parity check messages and sending resulting messages to the respective variable nodes; and,
   d5) incrementing counters of the variable nodes based on the resulting messages for determining the output symbols.

8. The method as defined in claim 1 wherein the elements of the parity check matrix are indexed using binary coefficients of a Galois field $GF(2^P)$.

9. The method as defined in claim 8 wherein the elements of the parity check matrix are represented by a polynomial.

10. The method as defined in claim 1 wherein said stochastic processing is performed in a stochastic decoder, and wherein the method further comprises:
    scaling each of the encoded samples by a scaling factor, the scaling factor being determined such that switching activity in the stochastic decoder is increased.

11. The method as defined in claim 10 wherein the scaling factor is a noise dependent scaling factor.

12. The method as defined in claim 11 wherein the linear code is a low density parity check code.

13. A stochastic decoder comprising:
    an input port for receiving a set of encoded symbols, the set of encoded symbols being representative of a sequence of information bits and parity bits generated using a linear code with a parity check matrix, the parity check matrix comprising elements of a Galois field;
    processing circuitry for generating a cumulative distribution function (CDF) of the symbols;
    logic circuitry in communication with the processing circuitry, the logic circuitry comprising logic components forming variable nodes, permutation nodes and parity check nodes, each of the variable nodes and the parity check nodes corresponding to a respective graphical variable node or graphical parity check node of a factor graph of the parity check matrix, the variable nodes and the parity check nodes of the logic components connected to each other in the same manner that the corresponding respective graphical variable nodes and graphical parity check nodes of the factor graph are connected, the permutation nodes being interposed between the variable nodes and the parity check nodes, wherein the permutation nodes, and the parity check nodes are for performing Galois field operations, the logic circuitry:
    determines for each encoded symbol a corresponding probability message;
    receives each probability message in a symbol-wise fashion at a respective variable node;
    passes each probability message in a symbol-wise fashion through the logic components and performing for each received symbol at the variable nodes the equality function, at the permutation nodes one of multiplication and division, and at the parity check nodes the parity check function, wherein each of the variable nodes provides an output symbol in dependence upon each received symbol; and provides a chosen symbol from a variable node to a permutation node if the variable node is in a hold state;

output circuitry in communication with the logic circuitry, the output circuitry:

receives the output symbols from the variable nodes;
determines if a stopping criterion has been satisfied; and,
determines an estimated sequence of information bits in dependence upon the output symbols.

14. The stochastic decoder as defined in claim 13 wherein the logic circuitry comprises one of:

a plurality of memories disposed along connections connecting the variable nodes with respective permutation nodes; and a plurality of memories disposed in the variable nodes.

15. The stochastic decoder as defined in claim 13 wherein elements of the parity check matrix are elements of a Galois field having a predetermined order and wherein each of the variable nodes comprises channel stream generator for providing a sequence of digital symbols, a bank of equality check units for performing the equality function, and a belief tracker for providing a belief symbol.

16. The stochastic decoder as defined in claim 13 wherein the permutation nodes are Galois field multipliers.

17. The stochastic decoder as defined in claim 16 wherein each of the permutation nodes is a GF(q) multiplier for multiplying the messages received from one of the variable nodes and memories by a predetermined constant element of the parity check matrix.

18. The stochastic decoder as defined in claim 17 wherein each of the permutation nodes is a GF(q) multiplier for multiplying the messages received from the parity check nodes by the inverse of the predetermined constant element of the parity check matrix.

19. The stochastic decoder as defined in claim 13 wherein each of the parity check nodes comprises a predetermined number of GF(q) adders, the number of GF(q) adders being determined in dependence upon the order of the Galois field.

20. The stochastic decoder as defined in claim 13 wherein each of the variable nodes and the parity check nodes correspond to the respective graphical variable node or graphical parity check node of the factor graph of the parity check matrix of a low density parity check code, the variable nodes and the parity check nodes of the logic components connected to each other in the same manner that the corresponding respective graphical variable nodes and graphical parity check nodes of the factor graph of the parity check matrix of the low density parity check code are connected.

* * * * *